United States Patent
Yang et al.

(10) Patent No.: US 10,964,559 B2
(45) Date of Patent: Mar. 30, 2021

(54) WAFER ETCHING APPARATUS AND METHOD FOR CONTROLLING ETCH BATH OF WAFER

(71) Applicant: TAIWAN SEMICONDUCTOR MANUFACTURING CO., LTD., Hsinchu (TW)

(72) Inventors: Tai-I Yang, Hsinchu (TW); Chih-Shen Yang, Kouhu Township (TW); Tien-Lu Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 149 days.

(21) Appl. No.: 14/320,181

(22) Filed: Jun. 30, 2014

(65) Prior Publication Data

US 2015/0380323 A1 Dec. 31, 2015

(51) Int. Cl.
*H01L 21/67* (2006.01)
*H01L 21/311* (2006.01)

(52) U.S. Cl.
CPC .. *H01L 21/67086* (2013.01); *H01L 21/31111* (2013.01); *H01L 21/67253* (2013.01)

(58) Field of Classification Search
None
See application file for complete search history.

(56) References Cited

U.S. PATENT DOCUMENTS

| | | | |
|---|---|---|---|
| 4,092,211 A | 5/1978 | Morris | |
| 5,779,927 A * | 7/1998 | Lo | B24B 37/013 156/345.15 |
| 8,105,851 B1 * | 1/2012 | Ku | H01L 21/31111 134/109 |
| 8,409,997 B2 | 4/2013 | Wei et al. | |
| 2004/0140365 A1 * | 7/2004 | Izuta | H01L 21/67086 237/12 |
| 2008/0087645 A1 * | 4/2008 | Izuta | C09K 13/04 216/93 |
| 2008/0179293 A1 * | 7/2008 | Wei | H01L 21/31111 216/84 |
| 2009/0087929 A1 * | 4/2009 | Yu | H01L 21/67253 438/8 |

(Continued)

FOREIGN PATENT DOCUMENTS

CN 101231939 A 7/2008

OTHER PUBLICATIONS

A. L. P. Rotondaro et al., "Use of H2SO4 for Etch Rate and Selectivity Control of Boiling H3PO4" Electrochemical Society Proceedings, vol. 99-36, p. 385-390 (1999).

*Primary Examiner* — Karla A Moore
*Assistant Examiner* — Margaret D Klunk
(74) *Attorney, Agent, or Firm* — Maschoff Brennan

(57) ABSTRACT

A wafer etching apparatus and a method for controlling an etch bath of a wafer is provided. The wafer etching apparatus includes an etching tank comprising an etch bath, an etch bath recycle system connected to the etching tank, a real time monitor (RTM) system connected to the etching tank, and a control system coupled with the RTM system and the etch bath recycle system. The wafer etching apparatus and the method for controlling an etch bath of the wafer both control the silicate concentration in the etch bath to stable an etching selectivity with respect to silicon oxide and silicon nitride.

20 Claims, 3 Drawing Sheets

(56) References Cited

U.S. PATENT DOCUMENTS

| | | | |
|---|---|---|---|
| 2013/0240143 A1* | 9/2013 | Kiyose | B44C 1/227 156/345.15 |
| 2014/0009751 A1* | 1/2014 | Pezzaniti | G01N 33/2835 356/70 |
| 2014/0290859 A1* | 10/2014 | Kobayashi | H01L 21/6708 156/345.15 |

* cited by examiner

WAFER ETCHING APPARATUS AND METHOD FOR CONTROLLING ETCH BATH OF WAFER

BACKGROUND

In semiconductor manufacture, silicon nitride plays an important role as a masking layer or as an insulator layer in semiconductor devices. Typically, a film of silicon nitride is formed over a semiconductor substrate upon which semiconductor devices are being fabricated. As semiconductor manufacturing process continues to advance, devices being designed and built on a single wafer surface area are significantly increasing and miniaturized, which results in a new set of processing issues, such as selectively etching silicon nitride with respect to underlying silicon oxide films.

One way to etch a silicon nitride layer is a wet chemical etching. The wet chemical etching use $H_3PO_4$ to remove or to pattern the silicon nitride layer on the wafer in an etching tank. During the wet chemical etching of the silicon nitride layer, silicate forms and inhibits the subsequent etching of silicon dioxide. The silicon oxide etching rate becomes dramatically lower as the silicate concentration in the etch bath increases. As a result, the etch bath has an etching selectivity with respect to silicon oxide and silicon nitride.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
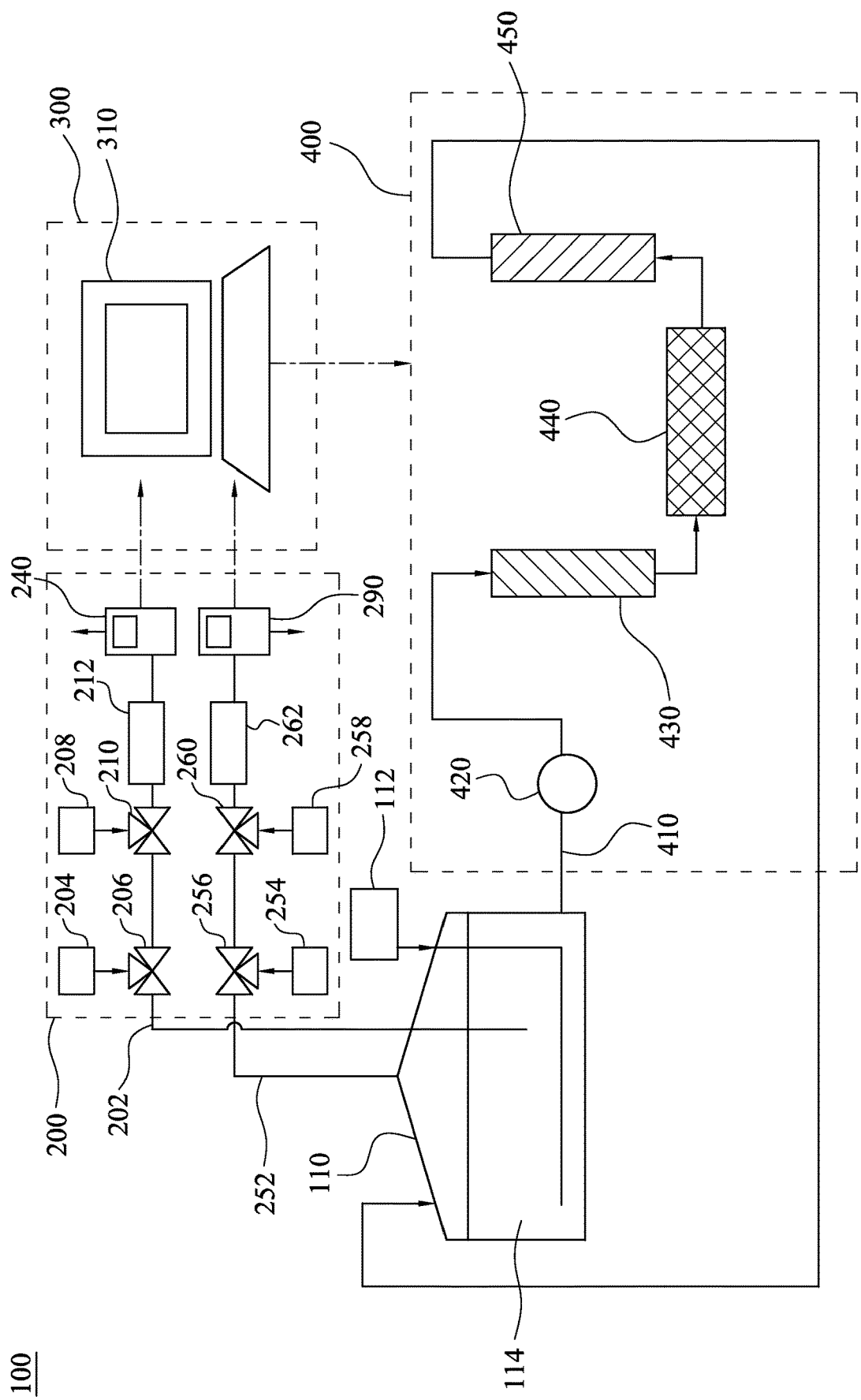
FIG. 1 is a schematic diagram of a wafer etching apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the terms "comprising," "including," "having," "involving," and the like are to be understood to be open-ended, i.e., to mean including but not limited to.

The singular forms "a," "an" and "the" used herein include plural referents unless the context clearly dictates otherwise. Therefore, reference to, for example, a dielectric layer includes embodiments having two or more such dielectric layers, unless the context clearly indicates otherwise.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The basic chemical reaction that model the etching of silicon nitride with phosphoric acid is:

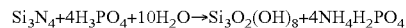

Wherein the $Si_3O_2(OH)_8$ after dehydration may become:

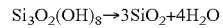

And the $NH_4H_2PO_4$ may form $NH_3+H_3PO_4$, wherein the $NH_3$ may evaporate. The chemical reaction shows that the silicon nitride etching process may be influenced by process parameters including phosphoric acid and silicate concentration, temperature of the etch bath and the life time of the etch bath. The silicon oxide etch rate becomes lower as the silicate concentration in the etch bath increases, therefore the etch bath has an etching selectivity with respect to silicon oxide and silicon nitride. However, when the silicate reaching saturation solubility, the dehydration of $Si_3O_2(OH)_8$ occurs to form $SiO_2$ and water. The generation of silicon oxide precipitates results in a particle source which is the major yield killer in semiconductor processing.

A wafer etching apparatus and a method for controlling an etch bath are therefore provided in the present disclosure. The wafer etching apparatus includes an etch tank, a real time monitor (RTM) system, a control system, and an etch bath recycle system for controlling the silicate concentration in the etch bath and maintaining the etching selectivity of the silicon nitride to the silicon oxide. The method for controlling etch bath of a wafer may also control and stable the silicate concentration in the etch bath. Therefore facilitate the silicon nitride etching process in the semiconductor manufacturing process.

Referring to FIG. 1, FIG. 1 is a schematic diagram of a wafer etching apparatus, in accordance with some embodiments. The wafer etching apparatus 100 includes an etching tank 110, a real time monitor (RTM) system 200, a control system 300, and an etch bath recycle system 400. The etching tank 110 includes an etch bath 114. In some embodiments, the etch bath 114 is a phosphoric acid. A gas supplier 112 is connected to the etching tank 110 and emits bubbles. In some embodiments, the gas supplier 112 supplies nitrogen. Wafers may be etched in the etching tank 110.

The real time monitor (RTM) system 200 is a system monitoring the process conditions in real time, which helps to monitor and control the conditions in the apparatus. The RTM system 200 may be a spectrophotometry RTM system. The RTM system 200 is connected to the etching tank 110 to monitor the silicate concentration in the etch bath by extracting an exhaust at the top of the etching tank 110, the etch bath at the bottom of the etching tank 110 or both. For example, the exhaust is a gas including $NH_3$. The RTM system 200 may include a detection line 202, a plurality of solution injection valves 206, 210, a plurality of solution reservoirs 204, 208, at least one mixing coil 212 and a spectrophotometer 240. The detection line 202 is connected to a bottom of the etching tank 110 to extract the etch bath in the etching tank 110 for detecting the silicate concentration in the etch bath. The solution reservoirs 204, 208 are connected with the solution injection valves 206, 210 which are coupled to the detection line 202. The solution reservoirs 204, 208 include solutions which are used to help to detect the silicate concentration in the etch bath. The mixing coil 212 is installed in the detection line 202 and used to mix the solutions flowed form the solution reservoirs 204,208 with the extracted etch bath to form a mixed solution. The spectrophotometer 240 is installed on the detection line 202 and detects the color or the concentration of the mixed solution 240. Then the spectrophotometer 240 sends the detected data to the control system 300.

In some embodiments, the RTM system 200 may include a detection line 252, a plurality solution injection valves 256, 260, a plurality of solution reservoirs 254,258, at least one mixing coil 262 and a spectrophotometer 290 to detect the silicate concentration of the etch bath from the exhaust in the top of the etching tank 110. The detection line 252 is connected to a top of the etching tank 110 to extract the exhaust in the etching tank 110 for detecting the silicate concentration in the etch bath. The solution reservoirs 254, 258 are connected with the solution injection valves 256, 260 which are coupled to the detection line 252. The solution reservoirs 254, 258 include solutions which are used to help to detect the silicate concentration in the etch bath. The mixing coil 262 is installed in the detection line 252 and is used to mix the solutions flowed form the solution reservoirs 254, 258 with the extracted exhaust to form a mixed solution. The spectrophotometer 290 is installed on the detection line 252 and detects the color or the concentration of the mixed solution. Then the spectrophotometer 290 sends the detected data to the control system 300.

The control system 300 may include a computer 310. In some embodiments, the control system is an advance process control (APC) system. The control system 300 is coupled with the RTM system 200 and the etch bath recycle system 400. The control system 300 is used to calculate the data from the RTM system 200 and controls the etch bath recycle system 400 for controlling the silicate concentration in the etching tank 110. For example, when the silicate concentration in the etching tank 110 is over a predetermined value, the control system 300 starts the etch bath recycle system 400 to decrease the silicate concentration in the etch bath 114 in response to a result of the calculating. For example, the predetermined value may be an etching selectivity with respect to silicon oxide:silicon nitride over 1:25. The etching selectivity with respect to silicon oxide:silicon nitride may be controlled in a range of about 1:15 to 1:25. When the etching selectivity is too high, the etching process may be hard to control. When the etching selectivity is too low, the silicon oxide may be etched together with the silicon nitride. The range of the etching selectivity may be determined depending on different products or processes.

The etch bath recycle system 400 includes a controlling valve 420, a cooler 430, a filter 440, and a heater 450. The controlling valve 420 is connected to the etching tank 110. The controlling valve 420 controls the etch bath 114 for starting to recirculate and flows into a recirculating line 410. The cooler 430 is connected to the controlling valve 420. The cooler 430 cools a recirculating etch bath, which is the etch bath in the recirculating line 410, to help to precipitate silicon oxide. In some embodiments, the temperature of the recirculating etch bath may decrease about 5-10° C. after the recirculating etch bath passing through the cooler 430. The filter 440 is connected to the cooler 430. The filter 440 filters the silicon oxide precipitate in the recirculating etch bath and makes the recirculating etch bath having no silicate left. The heater 450 is connected with the filter 440 and the etching tank 110. The heater 450 heats the recirculating etch bath to a temperature the same with that of the etch bath in the etching tank 110. In some embodiments, a recirculating pump is installed in the recirculating line 410. The recycle system 400 may recirculate the etch bath in response to the result of the calculating to remove the silicate in the recirculating etch bath, and recirculates the recirculating etch bath back into the etch tank 110, therefore decreases the silicate concentration in the etch bath.

Figure 2:
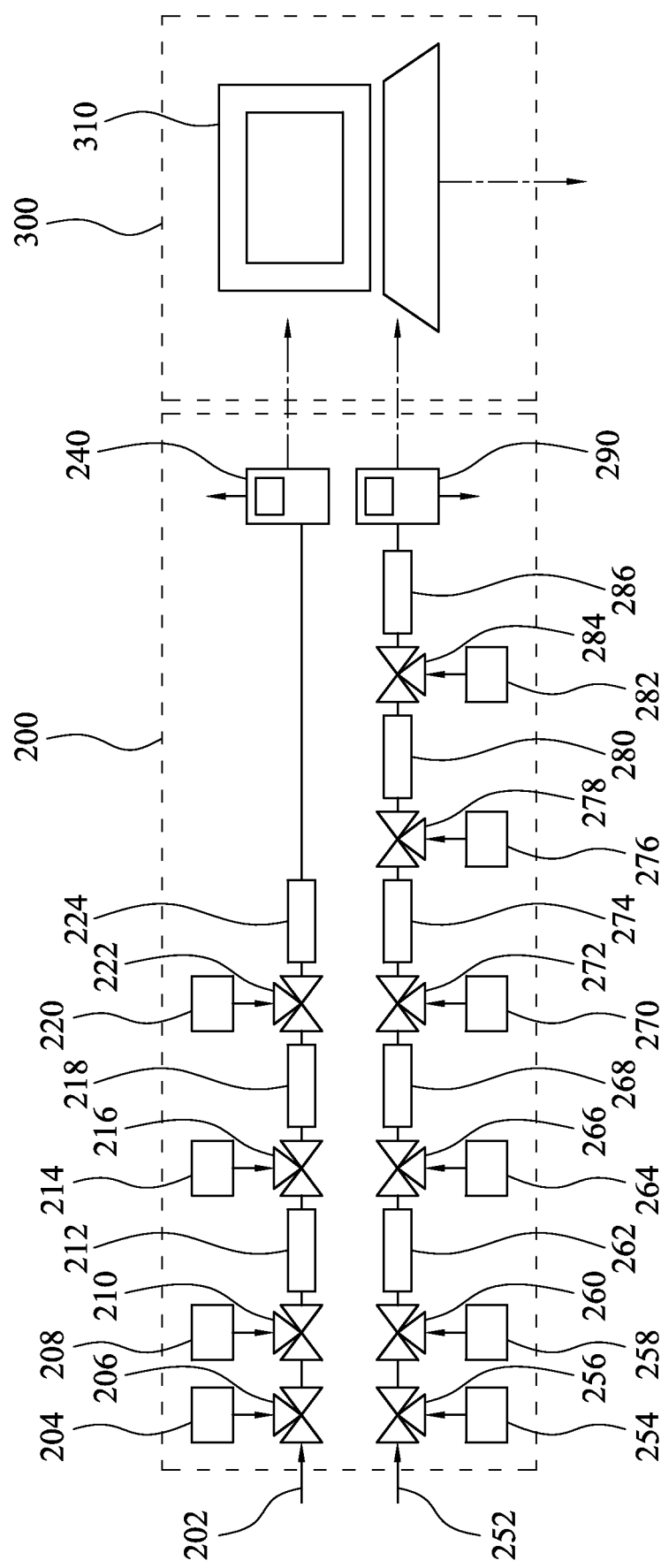
FIG. 2 is a schematic diagram of part of a wafer etching apparatus, in accordance with some embodiments.

Referring to FIG. 2, FIG. 2 is a schematic diagram of part of a wafer etching apparatus, in accordance with some embodiments. FIG. 2 is referred to, or together with FIG. 1, for clearly understanding the present disclosure. FIG. 2 shows the RTM system according to some embodiments. The RTM system 200 may include an ammonia RTM system, a silicate RTM system or both to detect the silicate concentration in the etch bath. The silicate RTM system may include a silicate detection line 202, a plurality of solution reservoirs 204, 208, 214, 220, a plurality of solution injection valves 206, 210, 216, 222, a plurality of mixing coils 212, 218, 224 and a spectrophotometer 240. The silicate detection line 202 is connected to the bottom of the etching tank to extract the etch bath for detecting the silicate concentration. The solution reservoirs 204, 208, 214, 220 are sodium hydroxide reservoir 204, molybdic acid reservoir 208, tartaric acid reservoir 214, and ascorbic acid reservoir 220. The sodium hydroxide reservoir 204 is installed next to the etching tank 110. The solution reservoirs 204, 208, 214, 220 are connected with the solution injection valves 206, 210, 216, 222, which are coupled to the silicate detection line 202. The solutions in the solution reservoirs 204, 208, 214, 220 are added to the extracted etch bath and mixed with mixing coils 212, 218, 224 sequentially. When the sodium hydroxide is added to the extracted etch bath, a following reaction occurred:

$Si_3O_2(OH)_8 + 6NaOH \rightarrow 3Na_2SiO_3 + 7H_2O$ The $Na_2SiO_3$ may be detected by the silicomolybdenum spectrophotometric method by adding the other above-mentioned solutions in the solution reservoirs, which includes molybdic acid, tartaric acid and ascorbic acid, and the color of the mixed solution may change from blue to transparent. The spectrophotometer 240 therefore can detect the silicate concentration in the etch bath. In some embodiments, the wavelength of a light used is 810 nm, and the detection limit is 2 ppb.

The ammonia RTM system may include an ammonia detection line 252, a plurality of solution reservoirs 254, 258, 264, 270, 276, 282, a plurality of solution injection valves 256, 260, 266, 272, 278, 284, a plurality of mixing coils 262, 268, 274, 280, 286 and a spectrophotometer 240. The ammonia detection line 252 is connected to the top of the etching tank to extract the exhaust including ammonia. For example, the exhaust is a gas. The solution reservoirs 254, 258, 264, 270, 276, 282 are water reservoir 254, phenol reservoir 258, nitroprusside reservoir 264, citrate reservoir 270, sodium hydroxide reservoir 276 and hypochlorite reservoir 282. The water reservoir 254 is installed next to the etching tank 110. The solution reservoirs 254, 258, 264, 270, 276, 282 are connected with the solution injection valves 256, 260, 266, 272, 278, 284, which are coupled to the ammonia detection line 252. The solutions in the solution reservoirs 254, 258, 264, 270, 276, 282 are added to the extracted exhaust and mixed with mixing coils 262, 268, 274, 280, 286 sequentially. When the water is added to the extracted exhaust, a following reaction is formed:

$NH_3(g) + H_2O \rightarrow NH_4OH$

The $NH_4OH$ may be detected by an indophenol blue spectrophotometric method by adding the other above-mentioned solutions in the solution reservoirs, which includes phenol, nitroprusside, citrate, sodium hydroxide and hypochlorite, and the color of the mixed solution may change to a green color. The spectrophotometer 290 therefore can detect the silicate concentration in the etch bath by detecting the ammonia concentration. In some embodiments, the wavelength of a light used is 640 nm, and the detection limit is 1 ppb. In some embodiments, the solutions have the same effect may also be used, not limited to the above-mentioned solutions.

The wafer etching apparatus in the present disclosure may control the silicate concentration by the control system, such as the APC system, the RTM system, and the etch bath recycle system with the etching tank. The etch bath recycle system prolongs the lifetime of the etch bath, therefore no new phosphoric acid is needed, also stables the silicate concentration in the etch bath, which maintains the desired etching selectivity to etch the silicon nitride.

Figure 3:
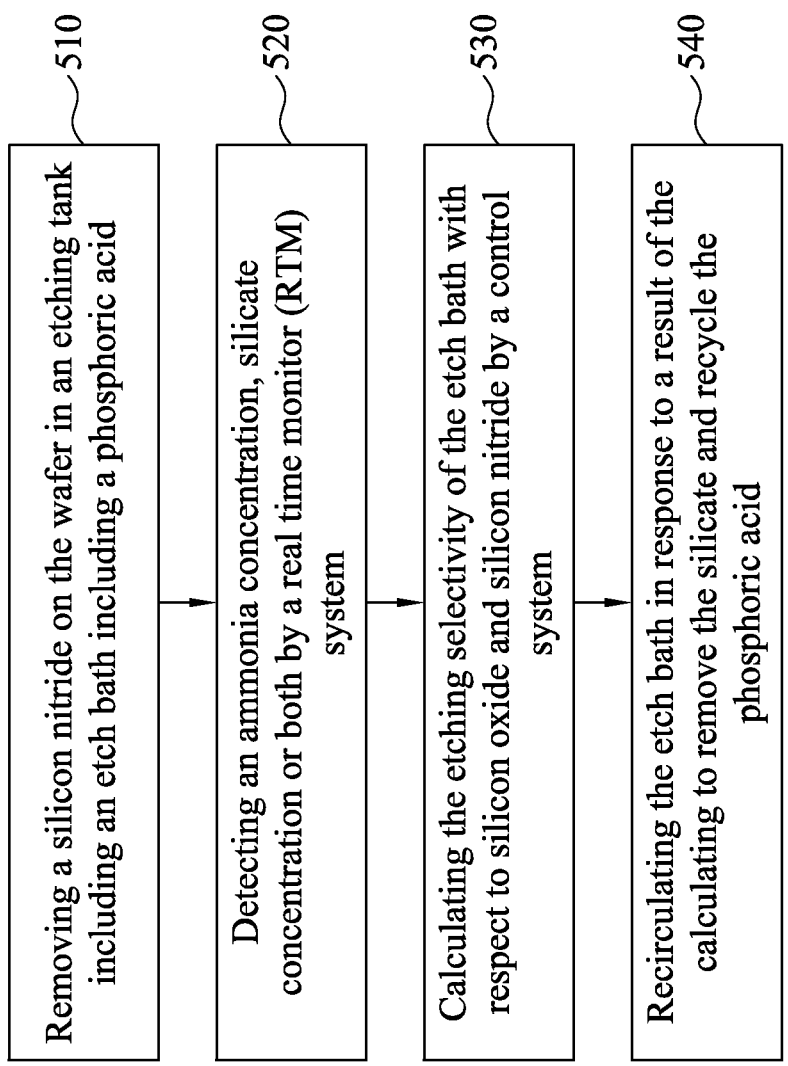
FIG. 3 is a flow chart illustrating a method for controlling etch bath of a wafer, in accordance with some embodiments.

Referring to FIG. 3, FIG. 3 is a flow chart illustrating a method for controlling etch bath of a wafer, in accordance with some embodiments. Operation 510 includes removing a silicon nitride on the wafer in an etching tank including an etch bath including a phosphoric acid. Phosphoric acid is used as etchant to etch the silicon nitride on the wafer. During the etching process, silicate is dissolved in the etch bath and affects the etching selectivity. The range of the etching selectivity may be adjusted depending on the product design demands. In some embodiments, the etch bath may have etching selectivity with respect to silicon oxide and silicon nitride in a range about 1:15 to about 1:25, for example 1:20.

Operation 520 includes detecting an ammonia concentration, silicate concentration, or both by a real time monitor (RTM) system. In order to detect the silicate concentration in the etch bath, two methods may be used in the present disclosure: one is detecting an ammonia concentration from exhaust of etch tank; the other is detecting the silicate concentration in the etch bath. The two methods may be used together to enhance the accuracy of the silicate concentration detection. The RTM system can provide the silicate concentration data in real time, thus provides a better control accuracy.

Detecting a silicate concentration by the RTM system include following operations: The etch bath is extracted from a bottom of the etching tank to the RTM system. A sodium hydroxide is added into the extracted etch bath. A molybdic acid is added into the extracted etch bath and is mixed with the extracted etch bath. A tartaric acid is added into the extracted etch bath and is mixed with the extracted etch bath. An ascorbic acid is added into the extracted etch bath and is mixed with the extracted etch bath. The silicate concentration in the extracted etch bath is detected by a spectrophotometer. And the spectrophotometer data is sent to a control system for further calculating. The silicate concentration is detected by a modified silicomolybdenum spectrophotometric method. Adding the above-mentioned solutions may change the color of the extracted etch bath. The spectrophotometer therefore may detect the silicon concentration by an absorbance of a light with wavelength 810 nm, and the concentration detection limit is 2 ppb.

Detecting an ammonia concentration by the RTM system include following operations: An exhaust is extracted from a top of the etching tank. Water is added with the exhaust to form an ammonia solution. A phenol is added into the ammonia solution and is mixed with the ammonia solution. A nitroprusside is added into the ammonia solution and is mixed with the ammonia solution. A citrate is added into the ammonia solution and is mixed with the ammonia solution. A sodium hydroxide is added into the ammonia solution and is mixed with the ammonia solution. A hypochlorite is added into the ammonia solution and is mixed with the ammonia solution. The ammonia concentration is detected in the ammonia solution by a spectrophotometer. And a spectrophotometer data is sent to a control system. The ammonia concentration is detected by an indophenol blue spectrophotometric method. Adding the above-mentioned solutions may change the color of the ammonia solution. The spectrophotometer therefore may detect the ammonia concentration by an absorbance of a light with wavelength 640 nm, and the concentration detection limit is 1 ppb. The ammonia concentration may be converted to a silicate concentration in the etch bath by a control system.

Operation 530 includes calculating the etching selectivity of the etch bath with respect to silicon oxide and silicon nitride by a control system. The data of the RTM systems is sent to the control system. The silicate concentration and the etching selectivity of the etch bath with respect to silicon oxide and silicon nitride in the etching tank are calculated by the control system. In some embodiments, the control system is an advance process control (APC) system.

Operation 540 includes recirculating the etch bath in response to a result of the calculating to remove the silicate and recycle the phosphoric acid. When the silicate concentration in the etch bath calculated by the control system is over a predetermined value, the recirculating process starts to circulate the etch bath and remove the silicate in the etch bath in response to the result of the calculating. The operation of recirculating the etch bath to remove the silicate and recycle the phosphoric acid includes following operations: A controlling valve at a bottom of the etching tank is opened to start recirculating the etch bath when the result indicates that the silicate concentration in the etch bath is over a predetermined value. A recirculating etch bath is cooled. A silica is filtered to remove the silicate in the recirculating etch bath. And the recirculating etch bath is heated. The recirculating etch bath is cooled to precipitate the silicate in the etch bath to form silica. In some embodiments, the temperature of the recirculating etch bath decrease about 5-10° C. After the silica be filtered, the recirculating etch bath is heated to maintain the same temperature with the etch bath in the etch tank. In some embodiments, the temperature of the recirculating etch bath increases about 5-10° C. Also after the silica filtering operation, the recirculating etch bath may include phosphoric acid and water only. Therefore the recirculating etch bath may decrease the silicate concentration in the etch bath when the recirculating etch bath following back into the etching tank. The silicate concentration and the etching selectivity of the etch bath is therefore be controlled by the operations disclosed herein. Also when the silicate concentration in the etch bath is detected lower than a predetermined value, the recirculating operation may be stopped in response to the result of the calculating. For example, the etching selectivity of the silicon oxide:silicon nitride calculated by the control system is lower than 1:15.

The method for controlling an etch bath of a wafer provided in the present disclosure may control the silicate concentration in real time to keep the silicon nitride on the wafer being etched in a stable rate, which is determined by the demand of the customers, for example, the etching selectivity with respect to silicon oxide:silicon nitride is in a range about 1:15 to about 1:25. The RTM system increases the concentration data accuracy and decreases the time to adjust the concentration. The recirculating operation makes the etch bath need not to add new phosphoric acid, prolongs the lifetime of the etch bath, and avoids the problem for adding the new phosphoric acid, which the extra dummy wafers need to be added into the etch bath to maintain the silicate concentration in the etch bath.

In various embodiments of the present disclosure, a wafer etching apparatus includes an etching tank including an etch bath; an etch bath recycle system connected to the etching tank; a real time monitor (RTM) system connected to the etching tank; and a control system coupled with the RTM system and the etch bath recycle system.

In various embodiments of the present disclosure, method for controlling an etch bath of a wafer includes the following operations. A silicon nitride on the wafer is removed in an etching tank including an etch bath including a phosphoric acid. An ammonia concentration, silicate concentration, or both is detected by a real time monitor (RTM) system. The etching selectivity of the etch bath with respect to silicon oxide and silicon nitride is calculated by a control system. The etch bath is recirculated in response to a result of the calculating to remove the silicate and recycle the phosphoric acid.

In various embodiments of the present disclosure, a wafer etching apparatus includes an phosphoric acid tank including an etch bath; an etch bath recycle system connected to the phosphoric acid tank, including: a cooler connected to the phosphoric acid tank, a filter connected to the cooler, and a heater connected with the filter and the phosphoric acid tank; a real time monitor (RTM) system connecting with the phosphoric acid tank including: an ammonia RTM system connected with the phosphoric acid tank, and a silicate RTM system connected with the phosphoric acid tank; and an advance process control (APC) system coupled with the spectrophotometry RTM systems and the etch bath recycle system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer etching apparatus comprising:
    an etching tank comprising an etch bath;
    an etch bath recycle system connected to the etching tank and configured to recycle the etch bath when the etch bath recycle system is started;
    a gas supplier connected to the etching tank and having a portion in the etch bath;
    an ammonia real time monitor (RTM) system connected to the etching tank and configured to detect an ammonia concentration, the ammonia RTM system comprising:
        a water reservoir;
        a detection line connected to the etching tank, wherein the portion of the gas supplier is below an end of the detection line proximal to the etching tank; and
        a plurality of solution injection valves coupled to the detection line, wherein one of the solution injection valves is on the detection line, is fluidly connected to the water reservoir, and is configured to inject water into the detection line; and
    a control system coupled with the ammonia RTM system and the etch bath recycle system and configured to start the etch bath recycle system based on the ammonia concentration detected by the ammonia RTM system.

2. The apparatus of claim 1, wherein the etch bath recycle system comprises:
    a controlling valve connected to the etching tank;
    a cooler connected to the controlling valve;
    a filter connected to the cooler; and
    a heater connected with the filter and the etching tank.

3. The apparatus of claim 2, wherein the controlling valve controls the etch bath to recirculate and flow into a recirculating line.

4. The apparatus of claim 3, further comprising a recirculating pump installed in the recirculating line.

5. The apparatus of claim 1, wherein the control system is an advance process control (APC) system.

6. The apparatus of claim 1, wherein the ammonia RTM system further comprises:
    at least one mixing coils installed on the detection line; and
    a spectrophotometer installed on the detection line.

7. The apparatus of claim 1, further comprising a silicate RTM system connected to the etching tank and configured to detect a silicate concentration.

8. The apparatus of claim 1, wherein the ammonia RTM system further comprises:
    a phenol reservoir, a nitroprusside reservoir, a citrate reservoir, a sodium hydroxide reservoir and a hypochlorite reservoir, wherein the water reservoir, the phenol reservoir, the nitroprusside reservoir, the citrate reservoir, the sodium hydroxide reservoir and the hypochlorite reservoir are sequentially coupled to the detection line respectively via the solution injection valves that are configured to respectively inject the water, phenol, nitroprusside, citrate, sodium hydroxide, and hypochlorite into the detection line.

9. The apparatus of claim 1, wherein the gas supplier supplies nitrogen.

10. The apparatus of claim 1, wherein the ammonia RTM system is a spectrophotometry RTM system.

11. The apparatus of claim 1, wherein the control system, the etch bath recycle system, and the ammonia RTM system are configured to control at least one of the ammonia concentration of the etch bath without adding a new etch bath to the etch tank.

12. The wafer etching apparatus of claim 1, wherein the end of the detection line is coupled to a top wall of the etching tank.

13. A wafer etching apparatus comprising:
    a phosphoric acid tank comprising an etch bath;
    an etch bath recycle system connected to the phosphoric acid tank, the etch bath recycle system comprising:
        a filter configured to filter silicon oxide precipitate in the etch bath;
        a cooler connected between the filter and the phosphoric acid tank and configured to precipitate silicon oxide in the etch bath; and a heater connected with the filter and the phosphoric acid tank and configured to heat the etch bath;

a real time monitor (RTM) system connected with the phosphoric acid tank and comprising:

an ammonia RTM system connected with the phosphoric acid tank and configured to detect an ammonia concentration, and comprising an ammonia detection line connected to the phosphoric acid tank; and a silicate RTM system connected with the phosphoric acid tank and configured to detect a silicate concentration, the silicate RTM system comprising:

a sodium hydroxide reservoir;

a silicate detection line connected to the phosphoric acid tank, wherein an end of the silicate detection line in the etch bath is below an end of the ammonia detection line above the etch bath; and a plurality of second solution injection valves coupled to the silicate detection line, wherein one of the second solution injection valves is on the silicate detection line, is fluidly connected to the sodium hydroxide reservoir, and is configured to inject sodium hydroxide into the silicate detection line; and an advance process control (APC) system coupled with the RTM system and the etch bath recycle system.

14. The apparatus of claim 13, wherein the ammonia detection line is connected to a top of the phosphoric acid tank, and the ammonia RTM system further comprises:

a plurality of first solution injection valves coupled to the ammonia detection line; and a plurality of first solution reservoirs connected with the plurality of first solution injection valves, wherein the first solution reservoirs are capable of containing water, phenol, nitroprusside, citrate, sodium hydroxide, and hypochlorite, respectively, wherein the first solution reservoirs are all connected to the ammonia detection line, and the first solution reservoir capable of containing the water is installed next to the phosphoric acid tank;

a plurality of first mixing coils installed on the ammonia detection line; and a first spectrophotometer installed at an end of the ammonia detection line.

15. The apparatus of claim 14, wherein the silicate RTM system further comprises:

a molybdic acid reservoir, a tartaric acid reservoir and an ascorbic acid reservoir, wherein the sodium hydroxide reservoir, the molybdic acid reservoir, the tartaric acid reservoir and the ascorbic acid reservoir are sequentially coupled to the silicate detection line;

a plurality of second mixing coils installed on the silicate detection line; and a second spectrophotometer installed at an end of the silicate detection line.

16. The apparatus of claim 14, wherein a wavelength of a light used in the first spectrophotometer is 640 nm.

17. An apparatus comprising:

an etching tank;

a real time monitor (RTM) system connected to the etching tank and configured to extract gas exhaust from the etching tank through a first detection line thereof and to detect a first concentration based on the gas exhaust extracted thereby, wherein the first detection line has a tip above a top surface of an etch bath when the etch bath is in the etching tank, and a reservoir is fluidly connected to the first detection line;

an injection valve connected to the reservoir and configured to inject a solution into the gas exhaust in the first detection line; and a recycle system connected to the etching tank and configured to recycle the etch bath in the etching tank, wherein the recycle system comprises a controlling valve and a heater that is downstream of the controlling valve.

18. The apparatus of claim 17, wherein the real time monitor (RTM) system is configured to extract the etch bath in the etching tank through a second detection line thereof that has a tip in the etch bath when the etch bath is in the etching tank and to detect a second concentration based on the etch bath extracted thereby.

19. The apparatus of claim 18, further comprising:

a control system connected to the RTM system and the recycle system, wherein the control system is configured to receive the first and second concentrations detected by the RTM system and to control operation of the recycle system based on one of the first and second concentrations received thereby.

20. The apparatus of claim 17, wherein the recycle system further comprises a cooler that is downstream of the controlling valve.

* * * * *